(12) United States Patent
Takaya et al.

(10) Patent No.: US 10,567,687 B2
(45) Date of Patent: Feb. 18, 2020

(54) SOLID STATE IMAGING DEVICE AND ELECTRONIC APPARATUS FOR REMOVING A NOISE COMPONENT

(71) Applicant: SONY SEMICONDUCTOR SOLUTIONS CORPORATION, Kanagawa (JP)

(72) Inventors: Koji Takaya, Kanagawa (JP); Ryoji Suzuki, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 15/763,956

(22) PCT Filed: Sep. 30, 2016

(86) PCT No.: PCT/JP2016/078982
§ 371 (c)(1),
(2) Date: Mar. 28, 2018

(87) PCT Pub. No.: WO2017/065019
PCT Pub. Date: Apr. 20, 2017

(65) Prior Publication Data
US 2018/0220092 A1  Aug. 2, 2018

(30) Foreign Application Priority Data
Oct. 15, 2015 (JP) ................. 2015-203889

(51) Int. Cl.
*H04N 5/374* (2011.01)
*H04N 5/359* (2011.01)
*H01L 27/146* (2006.01)

(52) U.S. Cl.
CPC ....... *H04N 5/374* (2013.01); *H01L 27/14643* (2013.01); *H04N 5/359* (2013.01)

(58) Field of Classification Search
CPC ...... H04N 5/374; H04N 5/3745; H04N 5/359; H01L 27/146; H01L 27/14643
See application file for complete search history.

(56) References Cited

U.S. PATENT DOCUMENTS

2011/0215223 A1* 9/2011 Unagami ............. H01L 27/148
250/208.1
2011/0221940 A1 9/2011 Kato et al.
(Continued)

FOREIGN PATENT DOCUMENTS

CN 102196199 A 9/2011
CN 103369262 A 10/2013
(Continued)

OTHER PUBLICATIONS

International Search Report and Written Opinion of PCT Application No. PCT/JP2016/078982, dated Dec. 20, 2016, 12 pages.

*Primary Examiner* — Antoinette T Spinks
(74) *Attorney, Agent, or Firm* — Chip Law Group

(57) ABSTRACT

The present disclosure relates to a solid-state imaging device and an electronic apparatus which can accurately extract a noise component so as to appropriately remove the noise component caused by stray light. A solid-state imaging device according to one aspect of the present disclosure, includes: an accumulation unit which accumulates signal charges generated by a photoelectric conversion unit and converts the signal charges into electric signals; and a first holding unit and a second holding unit which are arranged in series between the photoelectric conversion unit and the accumulation unit, temporarily hold the signal charges generated by the photoelectric conversion unit, and then transfer the signal charges to the accumulation unit, in which one of the first holding unit and the second holding unit is used to hold a noise charge to be input while holding the signal charges generated by the photoelectric conversion unit, and (Continued)

other of the first holding unit and the second holding unit is used to hold a noise charge to be input while not holding the signal charges generated by the photoelectric conversion unit. The present disclosure can be applied to, for example, a backside illumination type CMOS image sensor.

13 Claims, 23 Drawing Sheets

(56) References Cited

U.S. PATENT DOCUMENTS

| | | | |
|---|---|---|---|
| 2012/0320246 A1* | 12/2012 | Ikuma | H04N 5/3575 348/300 |
| 2013/0258156 A1 | 10/2013 | Okuno | |
| 2013/0277535 A1 | 10/2013 | Takeshita et al. | |
| 2015/0264333 A1* | 9/2015 | Ishiga | H01L 27/14623 382/154 |
| 2017/0013248 A1* | 1/2017 | Sato | H04N 5/23235 |

FOREIGN PATENT DOCUMENTS

| | | |
|---|---|---|
| CN | 103379296 A | 10/2013 |
| JP | 2011-188410 A | 9/2011 |
| JP | 2013-211649 A | 10/2013 |
| JP | 2013-225734 A | 10/2013 |

* cited by examiner

SOLID STATE IMAGING DEVICE AND ELECTRONIC APPARATUS FOR REMOVING A NOISE COMPONENT

CROSS REFERENCE TO RELATED APPLICATIONS

This application is a U.S. National Phase of International Patent Application No. PCT/JP2016/078982 filed on Sep. 30, 2016, which claims priority benefit of Japanese Patent Application No. JP 2015-203889 filed in the Japan Patent Office on Oct. 15, 2015. Each of the above-referenced applications is hereby incorporated herein by reference in its entirety.

TECHNICAL FIELD

The present disclosure relates to a solid-state imaging device and an electronic apparatus, and in particular, to a solid-state imaging device and an electronic apparatus capable of removing a noise component caused by stray light.

BACKGROUND ART

Conventionally, a CMOS image sensor (hereinafter, abbreviated as CIS) has been a rolling shutter system in which an exposure timing of each pixel is shifted by each row. In the case of the rolling shutter system, focal plane distortion occurs when an object moving at high speed is imaged. Thus, a global shutter system which can unify exposure timings of all the pixels has been developed.

The CIS adopting the global shutter system has the structure in which signal charges from a photodiode (PD) which performs photoelectric conversion according to incident light are transferred to a floating diffusion (FD) as a charge holding unit, and the FD holds the transferred signal charges until the next readout period.

However, if intense light is incident on the PD during the period when the FD holds the signal charges, a charge (hereinafter, also referred to as a noise charge) generated by stray light (PLS) corresponding to the incident light amount is mixed in the FD and superimposed as a noise component on the held signal charges. As a result, noise is included in a pixel signal so that the image quality of the obtained image is considerably deteriorated.

Thereupon, as a mechanism for subtracting the noise charges from charges (signal charges+noise charges) read out from the FD, there has been proposed an invention in which a noise charge capacitance is provided in each pixel circuit (e.g., see Patent Document 1).

CITATION LIST

Patent Document

Patent Document 1: Japanese Patent Application Laid-Open No. 2012-175259

SUMMARY OF THE INVENTION

Problems to be Solved by the Invention

In the case of the invention described in Patent Document 1, signal charges converted from incident light by the PD are transferred and held in the FD via a transfer transistor and a first switch, and similarly, noise charges generated by stray light in the PD are transferred and held in the noise charge capacitance via a transfer transistor and a second switch.

In this way, the switches are required for both the FD and the noise charge capacitance so that the element areas of the pixel circuits are enlarged accordingly. Moreover, since the switches are provided, KTC noise generated when the switches are turned on and off is superimposed on the charges.

Furthermore, since the arrangement of the FD and the noise charge capacitance with respect to the arrangement of the PD is not mentioned, the same amount of noise charges is not necessarily held in the FD and the noise charge capacitance, and the noise component caused by the stray light may be not appropriately removed.

The present disclosure has been made in light of the above circumstances, and it is an object of the present disclosure to accurately extract the noise component so as to appropriately remove the noise component caused by stray light that may occur in a solid-state imaging device of a global shutter system.

Solutions to Problems

A solid-state imaging device of a global shutter system according to one aspect of the present disclosure, in which exposure periods of all pixels are unified, includes: a photoelectric conversion unit which generates charges according to incident light for each pixel; an accumulation unit which accumulates the signal charges generated by the photoelectric conversion unit and converts the signal charges into electric signals; and a first holding unit and a second holding unit which are arranged in series between the photoelectric conversion unit and the accumulation unit, temporarily hold the signal charges generated by the photoelectric conversion unit, and then transfer the signal charges to the accumulation unit, in which one of the first holding unit and the second holding unit is used to hold a noise charge to be input while holding the signal charges generated by the photoelectric conversion unit, and other of the first holding unit and the second holding unit is used to hold a noise charge to be input while not holding the signal charges generated by the photoelectric conversion unit.

The solid-state imaging device according to one aspect of the present disclosure can further include an OFG which resets the photoelectric conversion unit by discharging the charges remaining in the photoelectric conversion unit.

The first and second holding units can be configured by CCDs.

The equivalent noise charge generated in the photoelectric conversion unit due to stray light can be input to the first and second holding units.

The first and second holding units may be arranged at symmetrical positions with respect to the focusing center of the photoelectric conversion unit.

The solid-state imaging device according to one aspect of the present disclosure can execute a first pixel drive processing in which an electric signal level, which is held by one of the first holding unit and the second holding unit and is based on the signal charges on which the noise charge is being superimposed, is acquired after an electric signal level based on the noise charge held by other of the first holding unit and the second holding unit, and a second pixel drive processing in which an electric signal level, which is held by one of the first holding unit and the second holding unit and is based on the signal charges on which the noise charge is being superimposed, is acquired before an electric signal level based on the noise charge held by other of the first holding unit and the second holding unit.

The first pixel drive processing and the second pixel drive processing can be alternately executed for each frame.

The first pixel drive processing and the second pixel drive processing can be alternately executed at each predetermined time.

A positional relationship of the first holding unit and the second holding unit arranged at symmetrical positions with respect to the focusing center of the photoelectric conversion unit can be switched for pixels of the same color in the same row or in the same column.

A solid-state imaging device according to one aspect of the present disclosure can execute a first pixel drive processing in which an electric signal level, which is held by one of the first holding unit and the second holding unit and is based on the signal charges on which the noise charge is being superimposed, is acquired after an electric signal level based on the noise charge held by other of the first holding unit and the second holding unit, or a second pixel drive processing in which an electric signal level, which is held by one of the first holding unit and the second holding unit and is based on the signal charges on which the noise charge is being superimposed, is acquired before an electric signal level based on the noise charge held by other of the first holding unit and the second holding unit.

The solid-state imaging device according to one aspect of the present disclosure can be of a backside illumination type.

The solid-state imaging device according to one aspect of the present disclosure can be of a surface illumination type.

The accumulation unit can be shared by a plurality of pixels.

In an electronic apparatus according to one aspect of the present disclosure on which a solid-state imaging device of a global shutter system in which exposure periods of all pixels are unified is mounted, the solid-state imaging device includes: a photoelectric conversion unit which generates charges according to incident light for each pixel; an accumulation unit which accumulates the signal charges generated by the photoelectric conversion unit and converts the signal charges into electric signals; and a first holding unit and a second holding unit which are arranged in series between the photoelectric conversion unit and the accumulation unit, temporarily hold the signal charges generated by the photoelectric conversion unit, and then transfer the signal charges to the accumulation unit, in which one of the first holding unit and the second holding unit is used to hold a noise charge to be input while holding the signal charge generated by the photoelectric conversion unit, and other of the first holding unit and the second holding unit is used to hold a noise charge to be input while not holding the signal charges generated by the photoelectric conversion unit.

According to one aspect of the present disclosure, one of the first holding unit and the second holding unit, which are arranged in series between the photoelectric conversion unit and the accumulation unit, temporarily hold the signal charges generated by the photoelectric conversion unit, and then transfer the signal charges to the accumulation unit, holds a noise charge to be input while holding the signal charges generated by the photoelectric conversion unit, and other of the first holding unit and the second holding unit holds the signal charges generated by the photoelectric conversion unit.

Effects of the Invention

According to one aspect of the present disclosure, it is possible to accurately extract the noise component so that a noise component caused by stray light can be appropriately removed.

MODE FOR CARRYING OUT THE INVENTION

Hereinafter, the best modes (hereinafter, referred to as embodiments) for carrying out the present disclosure will be described in detail with reference to the drawings.

<Configuration Example of Solid-State Imaging Device According to Present Embodiment>

Figure 1:
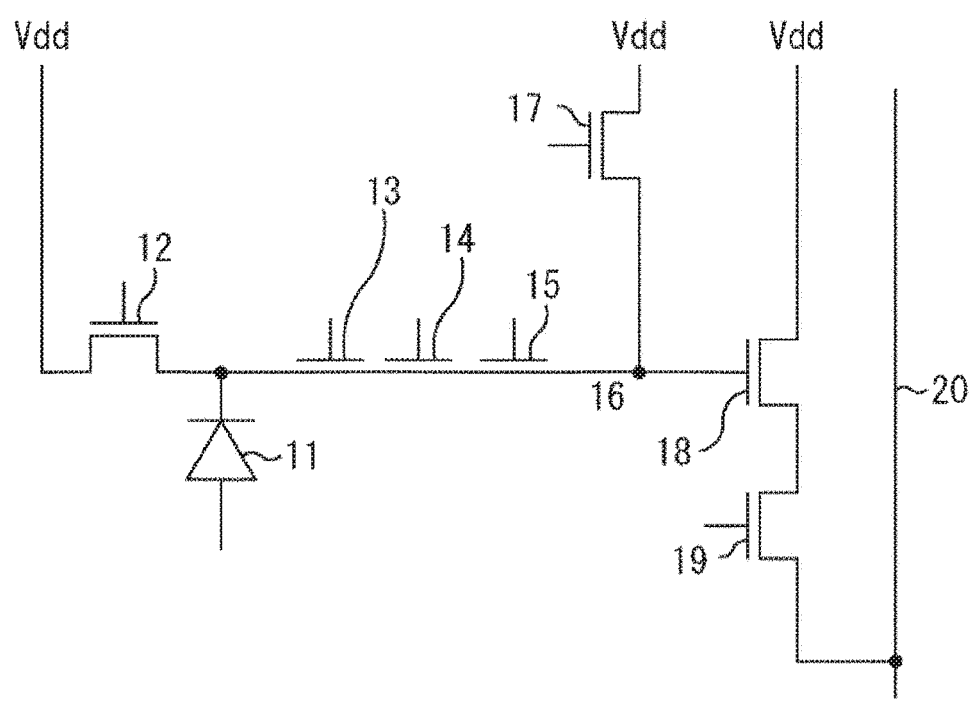
FIG. 1 is an equivalent circuit diagram showing a configuration example of a solid-state imaging device to which the present disclosure is applied.

FIG. 1 is an equivalent circuit diagram showing a configuration example of one pixel of a solid-state imaging device according to the present embodiment. Note that the solid-state imaging device according to the present embodiment can be applied to both the backside illumination type and the surface illumination type.

This solid-state imaging device has a photodiode (PD) 11, an overflow gate (OFG) 12, a first memory (MEM1) 13, a second memory (MEM2) 14, a transfer gate (TG) 15, a floating diffusion (FD) 16, an RST transistor 17, an AMP transistor 18 and an SEL transistor 19.

The PD 11 is a photoelectric conversion element, receives incident light and accumulates charges corresponding to that incident light to perform photoelectric conversion. The anode of the PD 11 is connected (grounded) to a GND, and the cathode thereof is connected to the transfer gate 15 via the first memory 13 and the second memory 14. The OFG 12 is driven when the charges remaining in the PD 11 in the initial state is discharged to an overflow drain.

One of the first memory 13 and the second memory 14 is used to hold a noise charge caused by stray light while holding the signal charges converted by the PD 11. In addition, the other of the first memory 13 and the second memory 14 is used to hold a noise charge caused by stray light while not holding the signal charges converted by the PD 11.

For example, a charge coupled device (CCD) of an embedded channel can be used for the first memory 13 and the second memory 14. By using the CCDs for the first memory 13 and the second memory 14, it is possible to completely transfer the charges accumulated in both the first memory 13 and the second memory 14 to the subsequent stage.

The transfer gate 15 is driven when the signal charges converted by the PD 11 are transferred to the FD 16. The FD 16 is a region formed at a connection point between the transfer gate 15 and the RST transistor 17, and the charges supplied thereto are converted into a voltage in the FD 16.

The RST transistor 17 is driven when the charges (voltage (potential)) accumulated in the FD 16 are reset.

The AMP transistor 18 is provided to buffer the voltage of the FD 16. The SEL transistor 19 is driven to select a pixel which outputs the potential buffered by the AMP transistor 18 to a vertical signal line 20.

Note that, for example, MOS transistors can be used for the OFG 12, the transfer gate 15, the RST transistor 17, the AMP transistor 18 and the SEL transistor 19.

Figure 2:
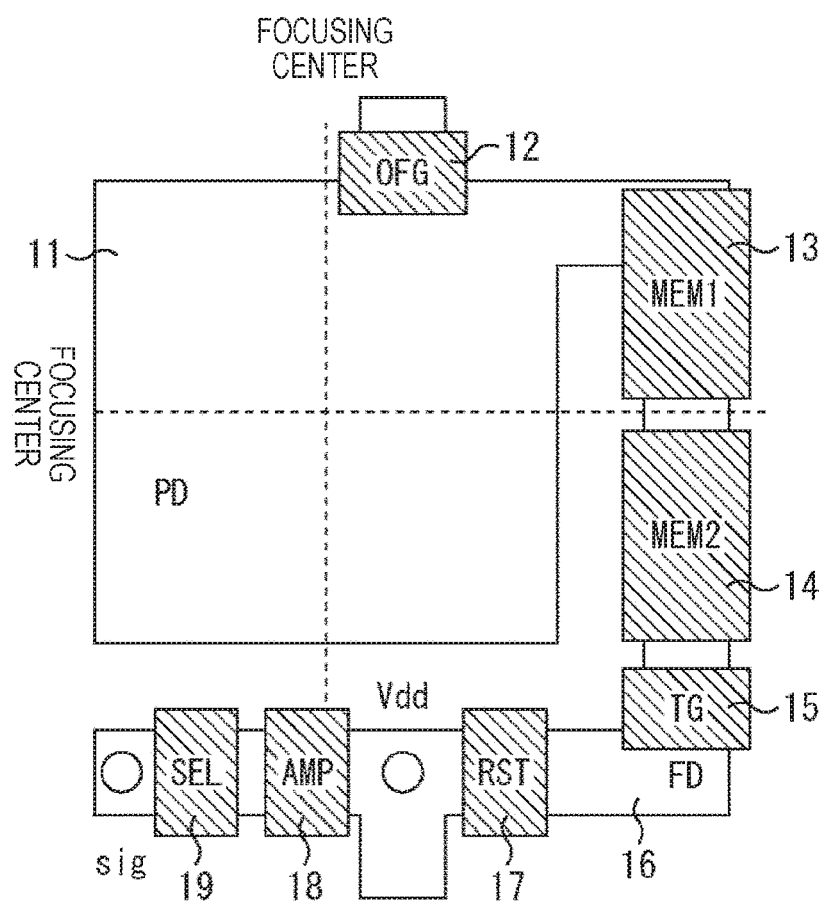
FIG. 2 is a top view showing a layout example of each constituent of the solid-state imaging device shown in FIG. 1.

FIG. 2 is a top view showing a layout example of each constituent of the solid-state imaging device shown in FIG. 1.

Among the constituents of the solid-state imaging device, in particular, the first memory 13 and the second memory 14 are arranged symmetrically with respect to the focusing center of the PD 11. As a result, the noise charges generated by the PD 11 due to the stray light can be evenly accumulated in the first memory 13 and the second memory 14, and the noise charges can be accurately removed in the subsequent stage from the signal charges on which the noise charges are superimposed.

Figure 3:
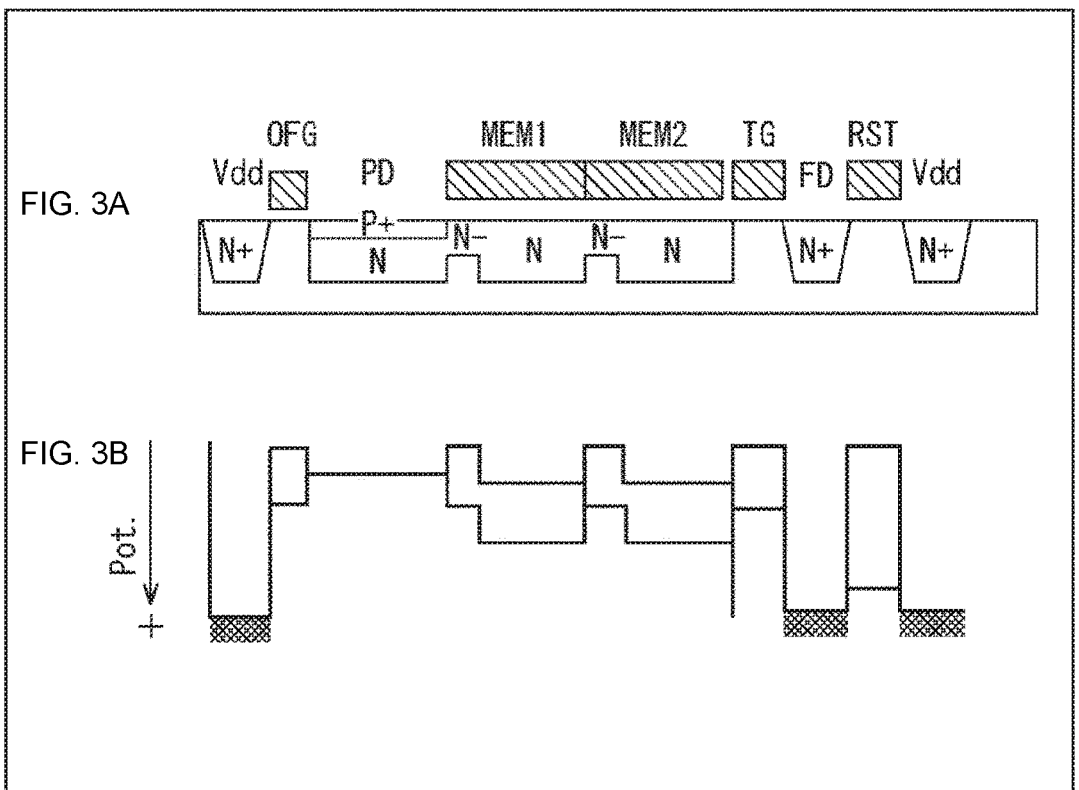
FIGS. 3A and 3B is a are diagrams showing a cross section of the solid-state imaging device and a potential corresponding thereto.

FIGS. 3A and 3B shows a cross section of the solid-state imaging device shown in FIG. 1 and a potential corresponding thereto. FIG. 3A is the cross-sectional view, and FIG. 3B shows a potential diagram in a state where the solid-state imaging device is completely reset and there is no charge remaining anywhere in the circuit.

<Pixel Drive Processing of Solid-State Imaging Device According to Embodiment of Present Disclosure>

Next, a first pixel drive processing of the solid-state imaging device shown in FIG. 1 will be described with reference to FIGS. 4 to 10. In the first pixel drive processing, the first memory 13 is used to accumulate the signal charges (including noise charges caused by stray light) converted by the PD 11, and the second memory 14 is used to accumulate the noise charges caused by stray light.

Figure 4:
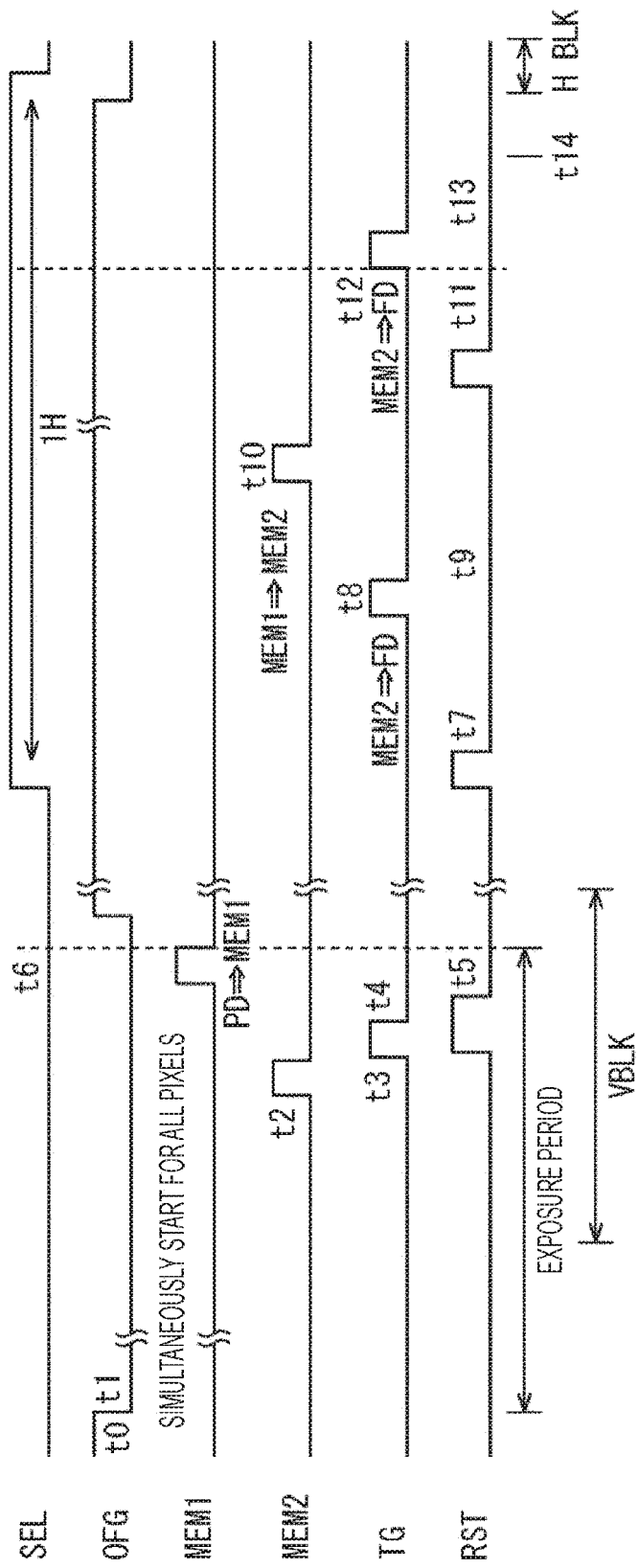
FIG. 4 is a timing chart corresponding to a first pixel drive processing.
Figure 5:
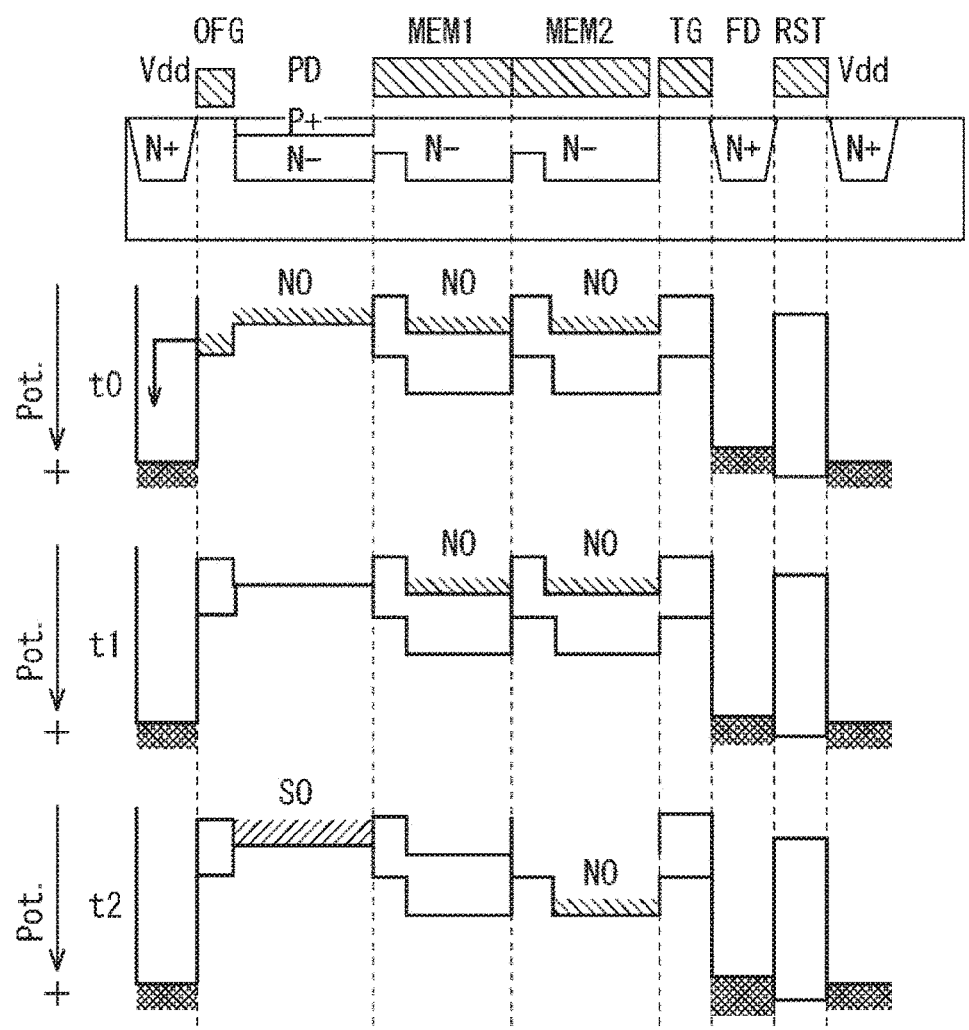
FIG. 5 is a diagram showing a transition of a potential diagram.
Figure 6:
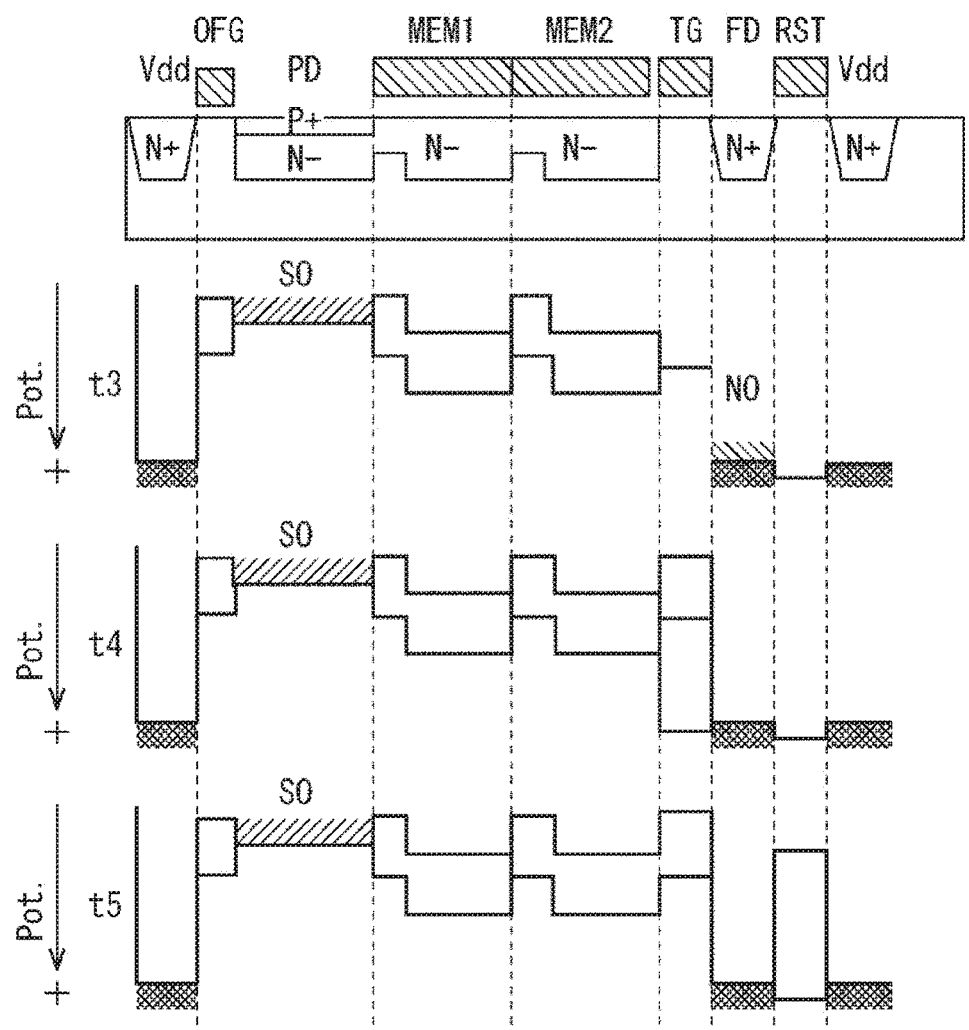
FIG. 6 is a diagram showing a transition of a potential diagram.
Figure 7:
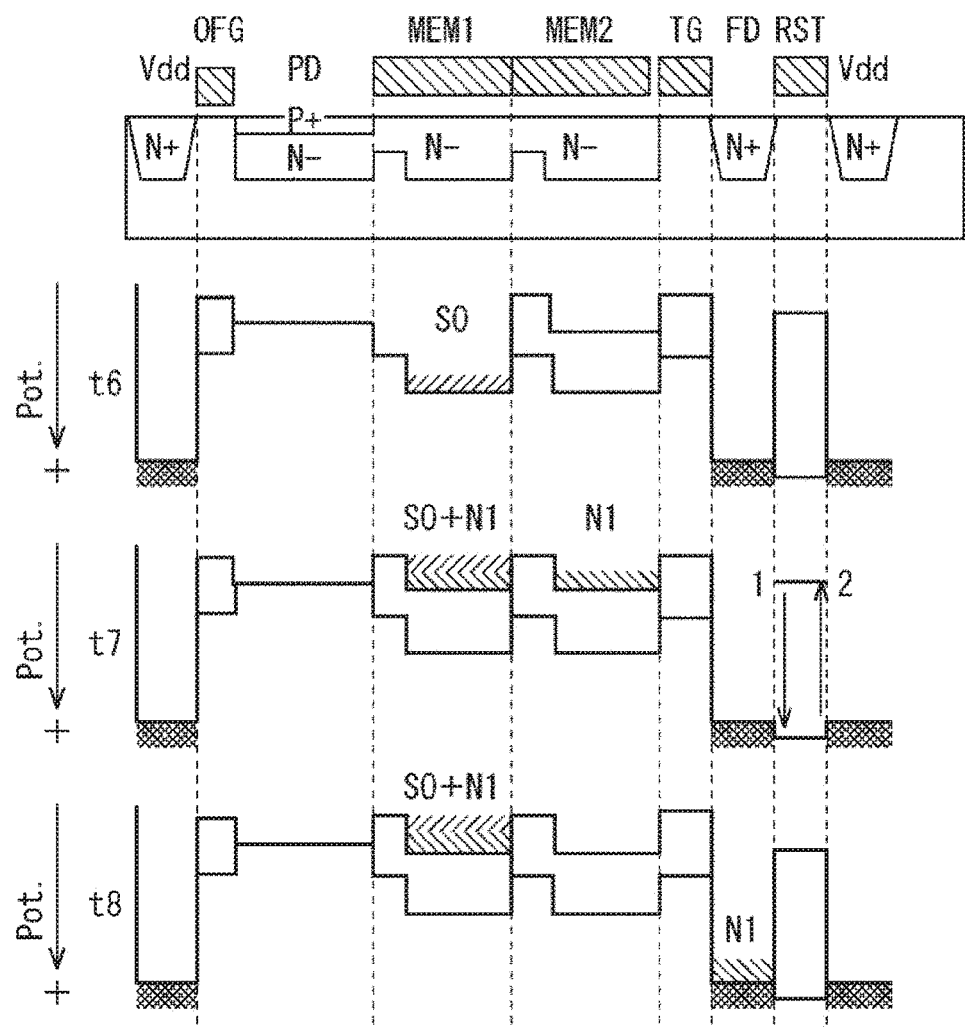
FIG. 7 is a diagram showing a transition of a potential diagram.
Figure 8:
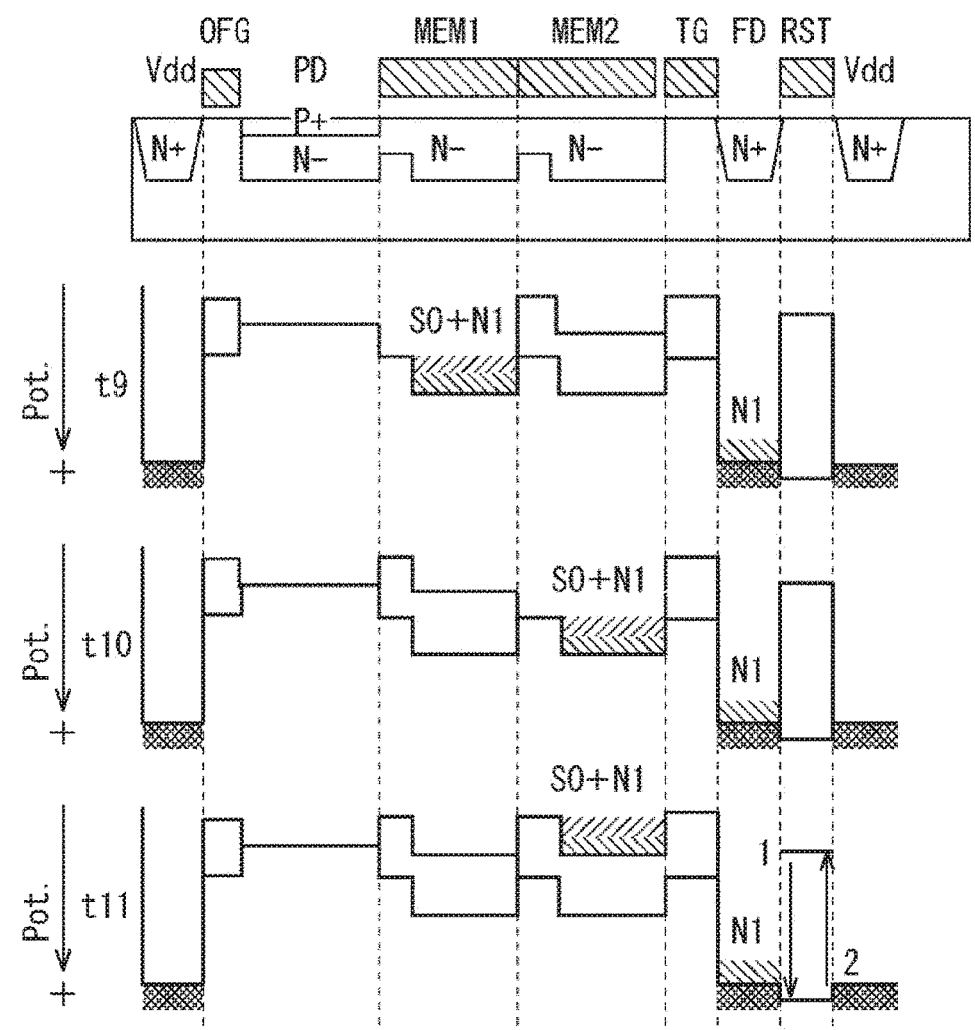
FIG. 8 is a diagram showing a transition of a potential diagram.
Figure 9:
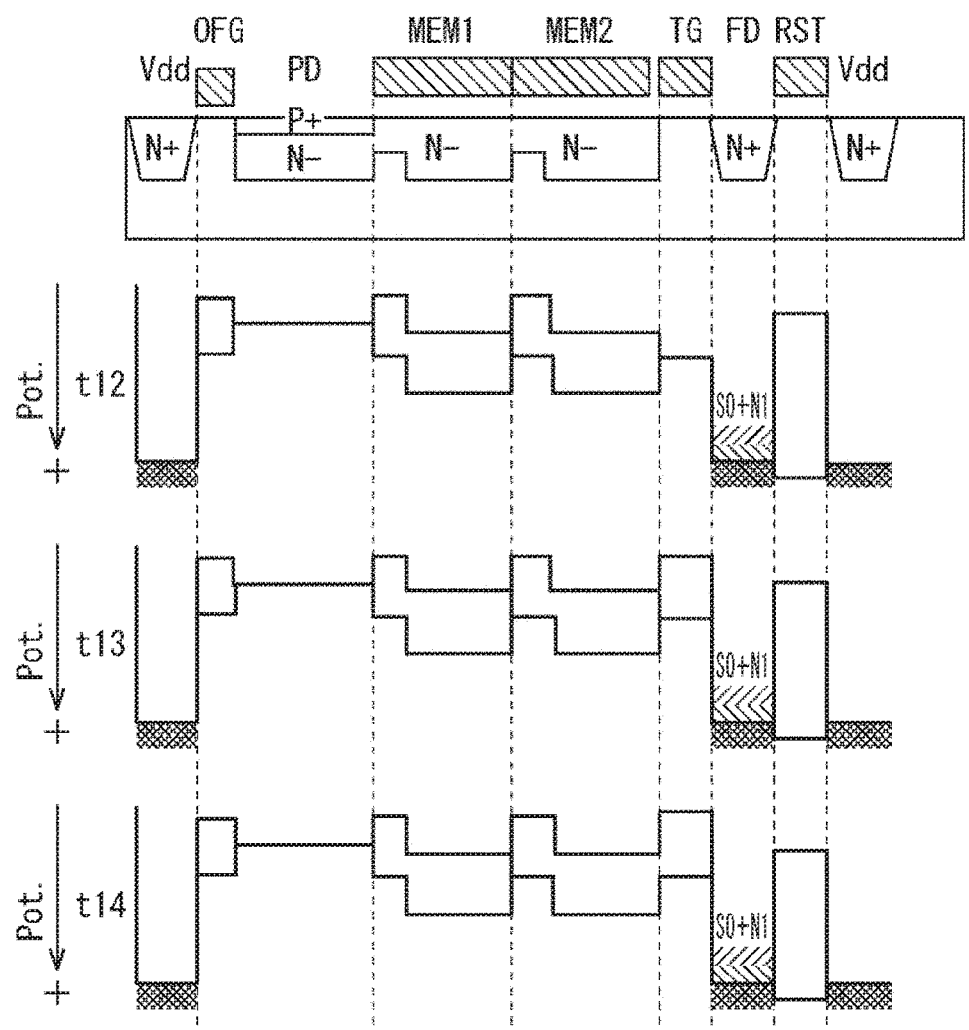
FIG. 9 is a diagram showing a transition of a potential diagram.

FIG. 4 is a timing chart showing the driving of each constituent in the first pixel drive processing.

Figure 10:
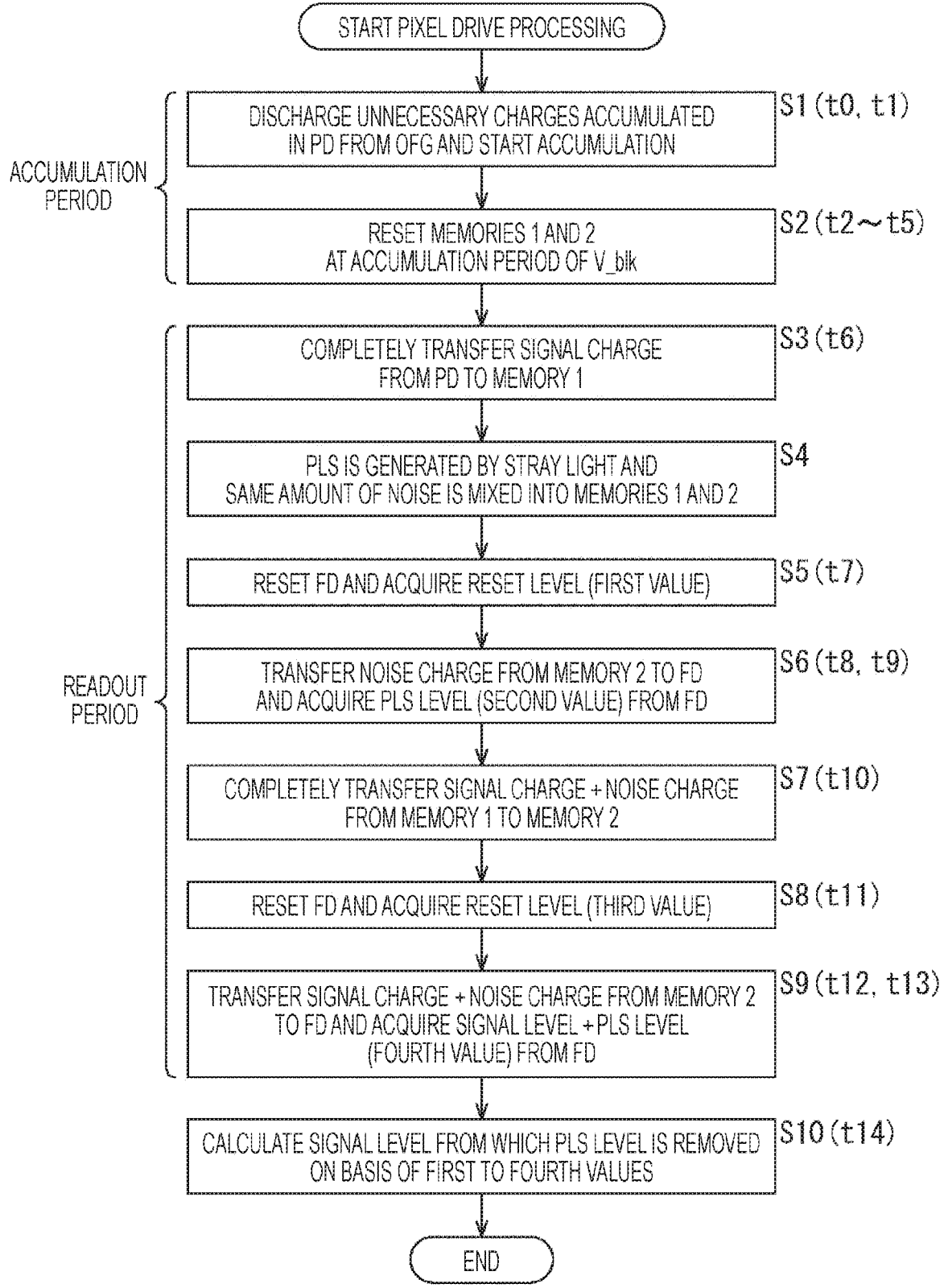
FIG. 10 is a flowchart illustrating the first pixel drive processing.

FIGS. 5 to 9 show the transitions of the potential diagrams in the first pixel drive processing. FIG. 10 is a flowchart illustrating the first pixel drive processing.

However, as a premise, suppose that the period during which a noise charge N1 generated by the PD 11 due to stray light is evenly accumulated in the first memory 13 and the second memory 14 is from a timing t6 after the end of an exposure period until a timing t12 when the transfer gate 15 is opened for the third time.

At the beginning, at a timing t0, the OFG 12 is opened, and unnecessary charge components NO in the initial state accumulated in the PDs 11 of all the pixels are discharged to Vdd. At a timing t1, the OFG 12 is closed, and exposure of the PDs 11 of all the pixels is simultaneously started (corresponding to step S1 in FIG. 10).

During a V_BLK period, at a timing t2, the second memory 14 is turned on and off to temporarily become a high potential state, the unnecessary charge components NO in the initial state accumulated in the first memory 13 are moved to the second memory 14, and the first memory 13 is reset. Next, at a timing t3, the transfer gate 15 is opened, and the RST transistor 17 is turned on. At a timing t4, the transfer gate 15 is closed. At a timing t5, the RST transistor 17 is turned off. Thus, the unnecessary charge components NO of the second memory 14 are reset (corresponding to step S2 in FIG. 10).

Next, at the timing t6 at the end of the exposure period, the first memory 13 is turned on and off to temporarily become a high potential state, and signal charges S0 accumulated in the PD11 during the exposure period are completely transferred to the first memory 13 (corresponding to step S3 in FIG. 10). Thereafter, noise charges N1 generated by the PD 11 due to stray light are evenly accumulated in the first memory 13 and the second memory 14 (corresponding to step S4 in FIG. 10).

At a timing t7, the RST transistor 17 is turned on, the FD 16 is reset, and a level (reset level) of the FD 16 at this time is acquired as a first value (corresponding to step S5 in FIG. 10).

Subsequently, at a timing t8, the transfer gate 15 is opened, the noise charges N1 accumulated in the second memory 14 are transferred to the FD 16. At a timing t9, the transfer gate 15 is closed, and a level (PLS level) of the FD 16 at this time is acquired as a second value (corresponding to step S6 in FIG. 10).

Next, at a timing t10, the second memory 14 is turned on and off to temporarily become a high potential state, the signal charges S0+noise charges N1 accumulated in the first memory 13 are moved to the second memory 14, and the first memory 13 is reset (corresponding to step S7 in FIG. 10).

At a timing t11, the RST transistor 17 is turned on, the FD 16 is reset, and a level (reset level) of the FD 16 at this time is acquired as a third value (corresponding to step S8 in FIG. 10).

Subsequently, at the timing t12, the transfer gate 15 is opened, the signal charges S0+noise charges N1 transferred to the second memory 14 are transferred to the FD 16. At a timing t13, the transfer gate 15 is closed, and a level (signal+PLS level) of the FD 16 at this time is acquired as a fourth value (corresponding to step S9 in FIG. 10).

Thereafter, at a timing t14, a pixel signal value corresponding to the signal charges S0 from which the noise charges N1 have been removed is calculated in the subsequent stage according to the following equation (1) (corresponding to step S10 in FIG. 10).

$$\text{Pixel signal value} = (\text{fourth value} - \text{third value}) - (\text{second value} - \text{first value}) \quad (1)$$

Note that it is necessary to reserve 1H of memory in order to execute the above arithmetic operation.

Next, a second pixel drive processing of the solid-state imaging device shown in FIG. 1 will be described with reference to FIGS. 11 to 16. In the second pixel drive processing, the first memory 13 is used to accumulate the noise charges caused by stray light, and the second memory 14 is used to accumulate the signal charges (including the noise charges caused by stray light) converted by the PD 11.

Figure 11:
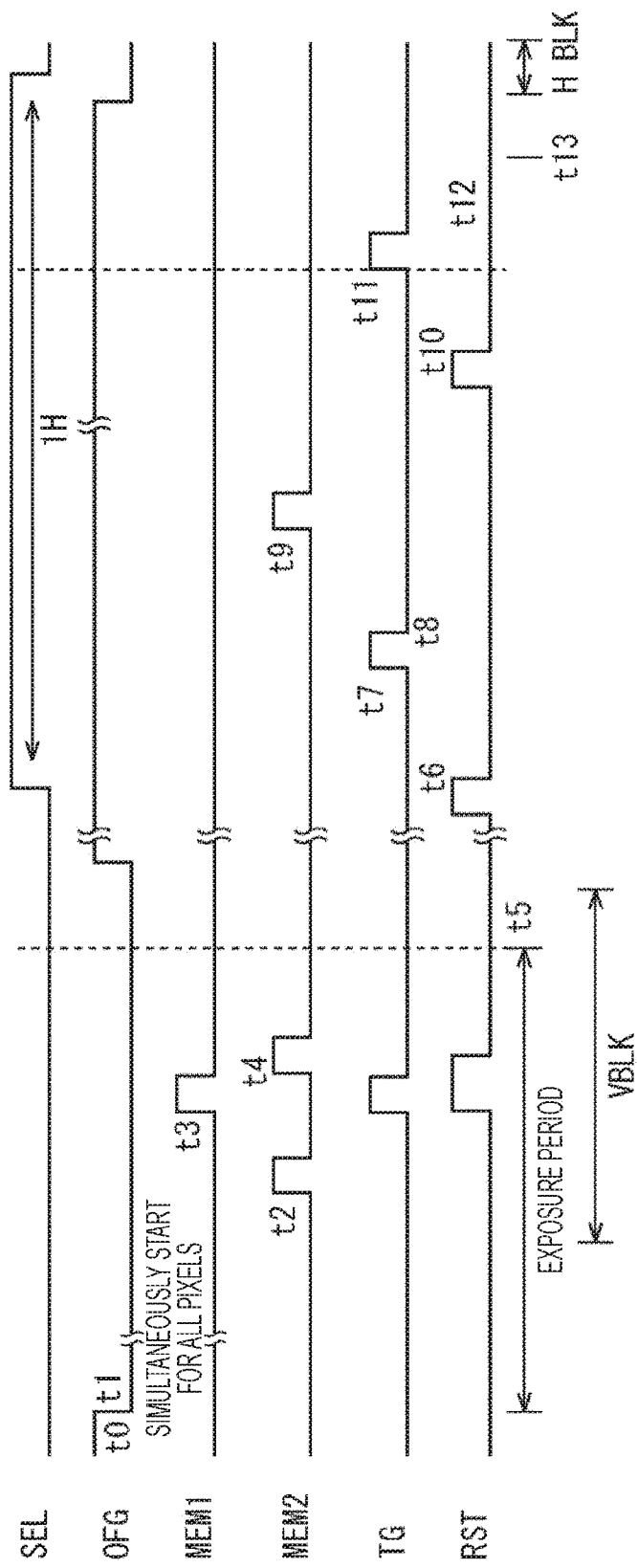
FIG. 11 is a timing chart corresponding to a second pixel drive processing.
Figure 12:
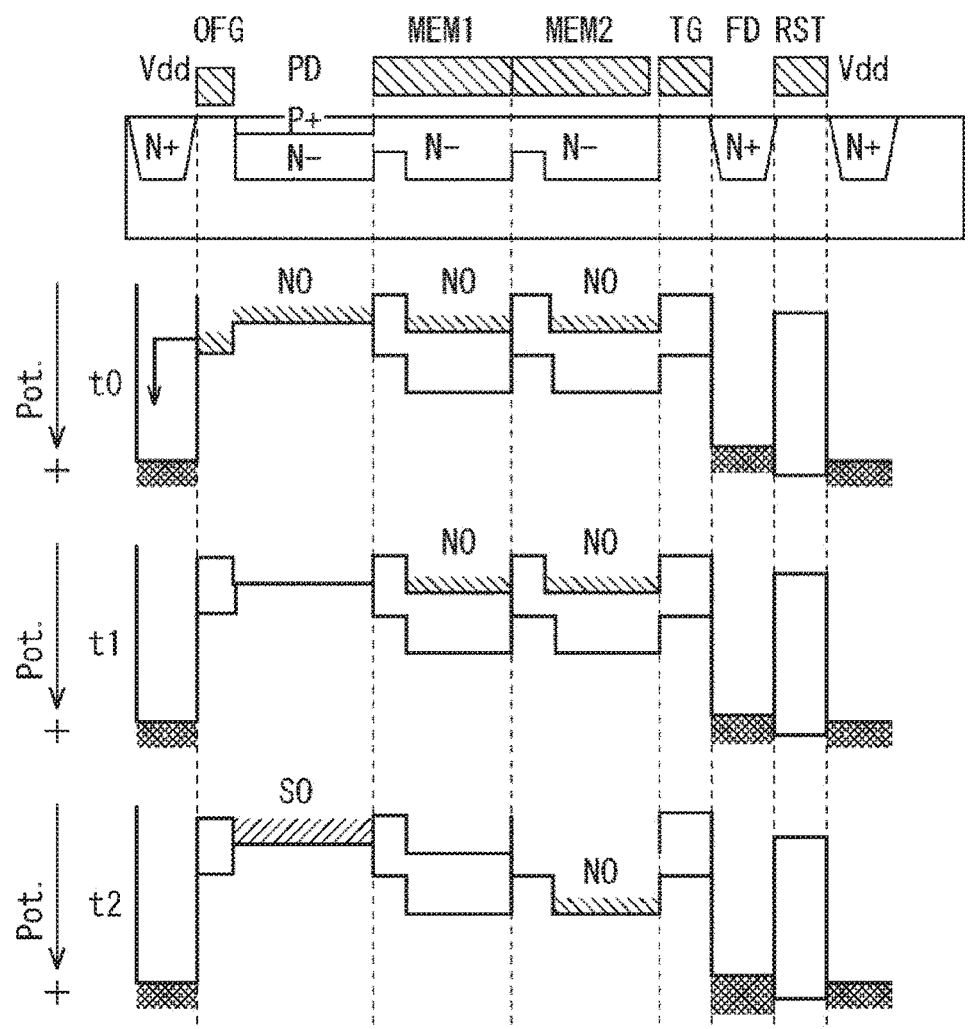
FIG. 12 is a diagram showing a transition of a potential diagram.
Figure 13:
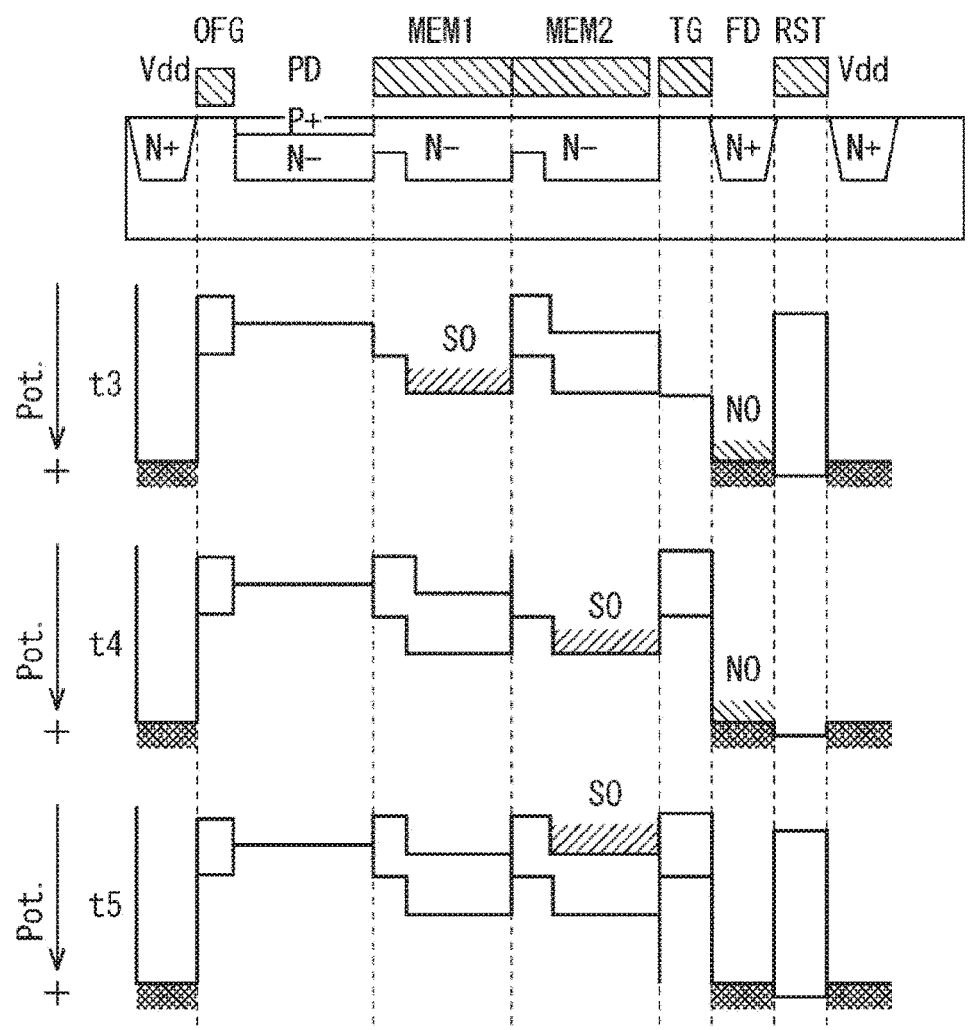
FIG. 13 is a diagram showing a transition of a potential diagram.
Figure 14:
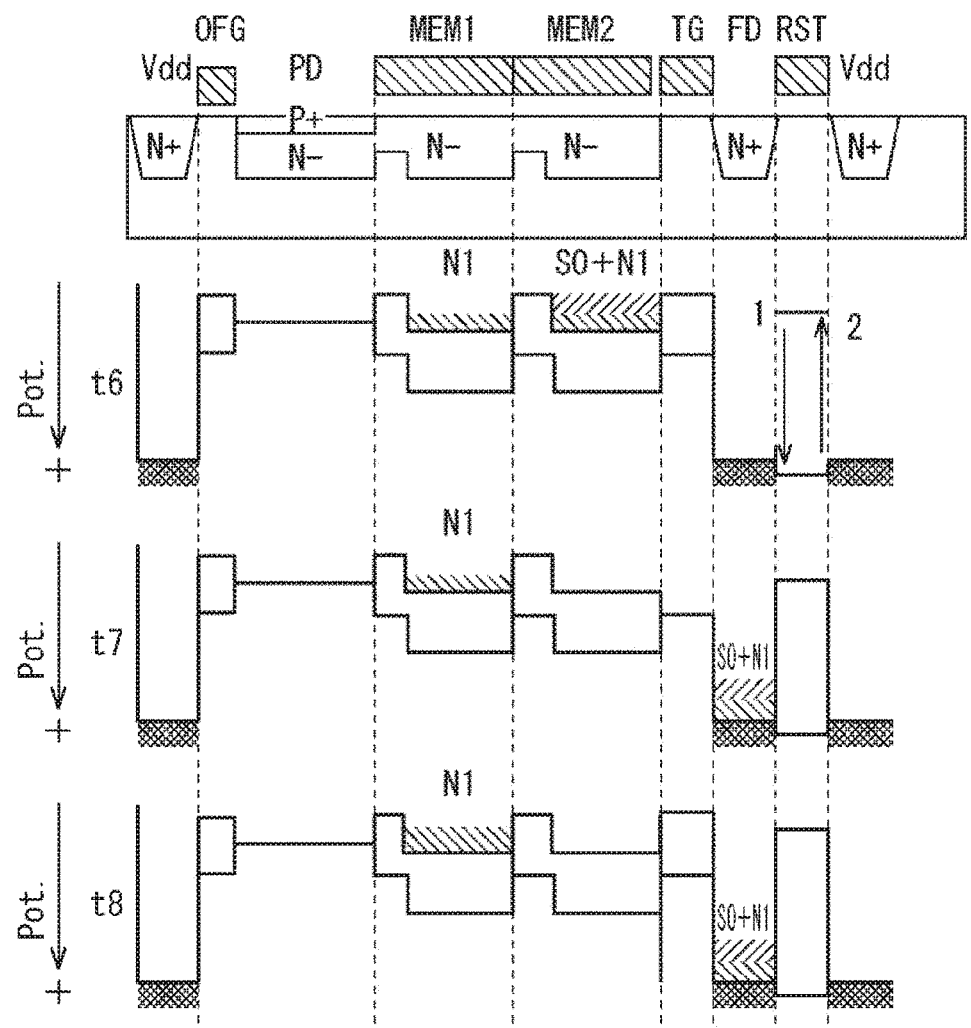
FIG. 14 is a diagram showing a transition of a potential diagram.
Figure 15:
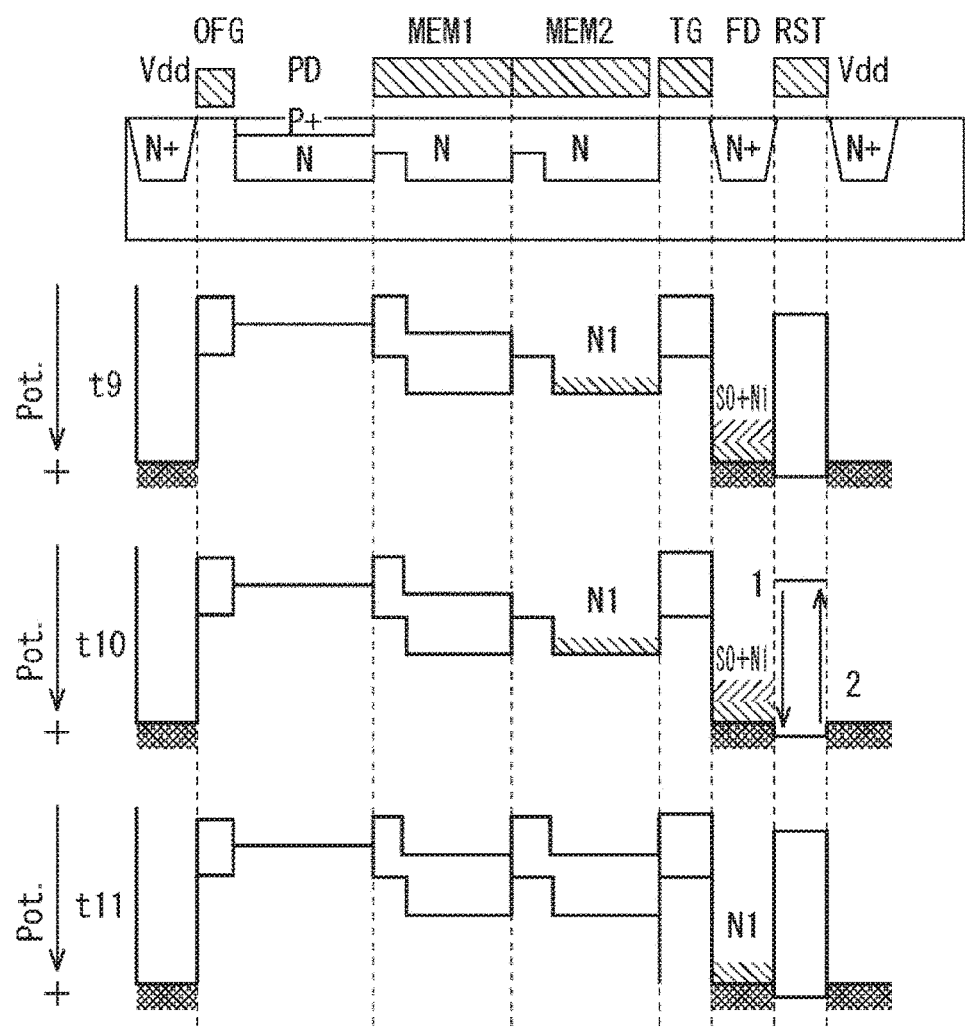
FIG. 15 is a diagram showing a transition of a potential diagram.
Figure 16:
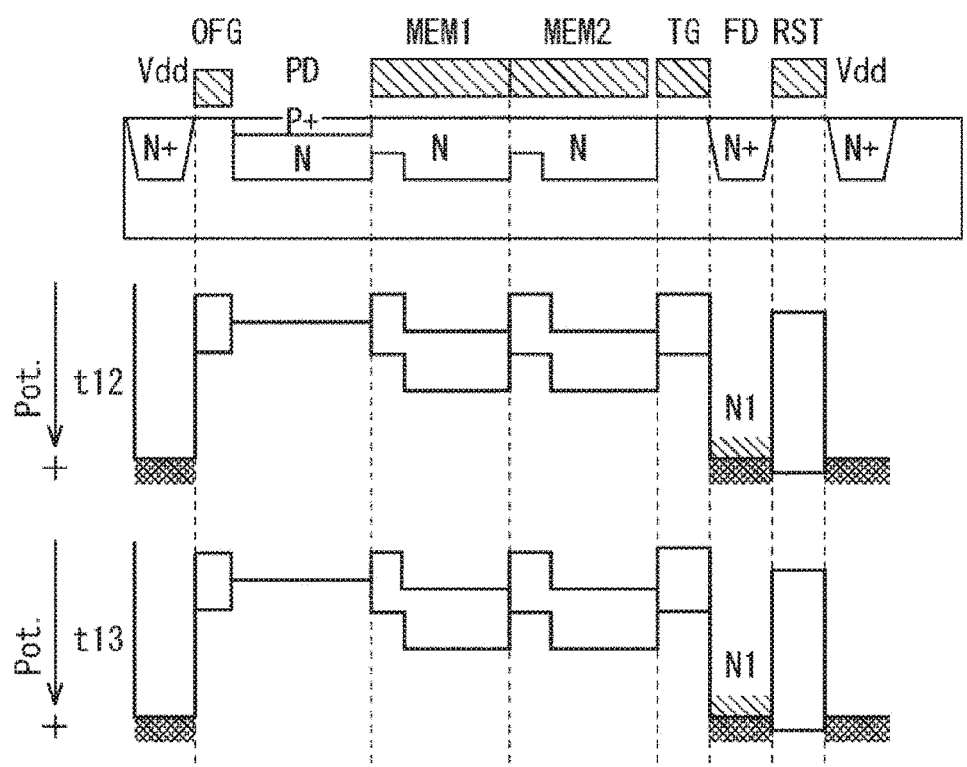
FIG. 16 is a diagram showing a transition of a potential diagram.

FIG. 11 is a timing chart showing the driving of each constituent in the second pixel drive processing.

FIGS. 12 to 16 show the transitions of the potential diagrams at each timing t0 to t14 in FIG. 4. FIG. 10 is a flowchart corresponding to the timing chart in FIG. 4.

However, as a premise, suppose that the period during which a noise charge N1 generated by the PD 11 due to the stray light is evenly accumulated in the first memory 13 and the second memory 14 is from a timing t5 after the end of an exposure period until a timing t11 when the transfer gate 15 is opened for the third time.

At the beginning, at a timing t0, the OFG 12 is opened, and unnecessary charge components NO in the initial state accumulated in the PDs 11 of all the pixels are discharged to Vdd. At a timing t1, the OFG 12 is closed, and exposure of the PDs 11 of all the pixels is simultaneously started.

During a V_BLK period, at a timing t2, the second memory 14 is turned on and off to temporarily become a high potential state, the unnecessary charge components NO in the initial state accumulated in the first memory 13 are moved to the second memory 14, and the first memory 13 is reset. Next, at a timing t3, the first memory 13 is turned on and off to temporarily become a high potential state, signal charges S0 accumulated in the PD 11 during the exposure period are completely transferred to the first memory 13, the transfer gate 15 is opened, and the RST transistor 17 is turned on so that the unnecessary charge components NO of the second memory 14 are transferred to the FD 16 and discharged to Vdd.

Next, at a timing t4, the second memory 14 is turned on and off to temporarily become a high potential state, the signal charges S0 accumulated in the first memory 13 are moved to the second memory 14, and the transfer gate 15 is closed. Subsequently, at the timing t5 at the end of the exposure period, the RST transistor 17 is turned off. Thereafter, the noise charges N1 generated by the PD 11 due to stray light are evenly accumulated in the first memory 13 and the second memory 14.

At a timing t6, the RST transistor 17 is turned on, the FD 16 is reset, and a level (reset level) of the FD 16 at this time is acquired as a first value.

Subsequently, at a timing t7, the transfer gate 15 is opened, the signal charges S0+noise charges N1 accumulated in the second memory 14 are transferred to the FD 16. At a timing t8, the transfer gate 15 is closed, and a level (signal+PLS levels) of the FD 16 at this time is acquired as a second value.

Next, at a timing t9, the second memory 14 is turned on and off to temporarily become a high potential state, the noise charges N1 accumulated in the first memory 13 are moved to the second memory 14, and the first memory 13 is reset.

At a timing t10, the RST transistor 17 is turned on, the FD 16 is reset, and a level (reset level) of the FD 16 at this time is acquired as a third value.

Subsequently, at a timing t11, the transfer gate 15 is opened, and the noise charges N1 transferred to the second memory 14 are transferred to the FD 16. At a timing t12, the transfer gate 15 is closed, and a level (PLS level) of the FD 16 at this time is acquired as a fourth value.

Thereafter, at a timing t13, a pixel signal value corresponding to the signal charges S0 from which the noise charges N1 have been removed is calculated in the subsequent stage according to the following equation (2).

$$\text{Pixel signal value} = (\text{second value} - \text{first value}) - (\text{fourth value} - \text{third value}) \quad (2)$$

Note that it is necessary to reserve 1H of memory in order to execute the above arithmetic operation.

The first pixel drive processing and the second pixel drive processing described above may be executed by adopting either one of them or may be executed alternately at a predetermined cycle (e.g., each frame or each predetermined time).

In a case where the first pixel drive processing and the second pixel drive processing are executed alternately, for example, due to the influence of the optical incident angle, it is possible to obtain a ratio of the noise charges accumulated in the first memory 13 and the second memory 14 for each viewing angle area by arithmetic operation processing or the like even when the noise charges NO accumulated in the first memory 13 and the second memory 14 are not the same. Thus, it is possible to remove the noise components more accurately than a case where one of the processing is adopted and executed.

<Arrangement Example of Pixels in Solid-State Imaging Device>

Next, an arrangement example of pixels in the solid-state imaging device according to an embodiment of the present disclosure will be described.

Figure 17:
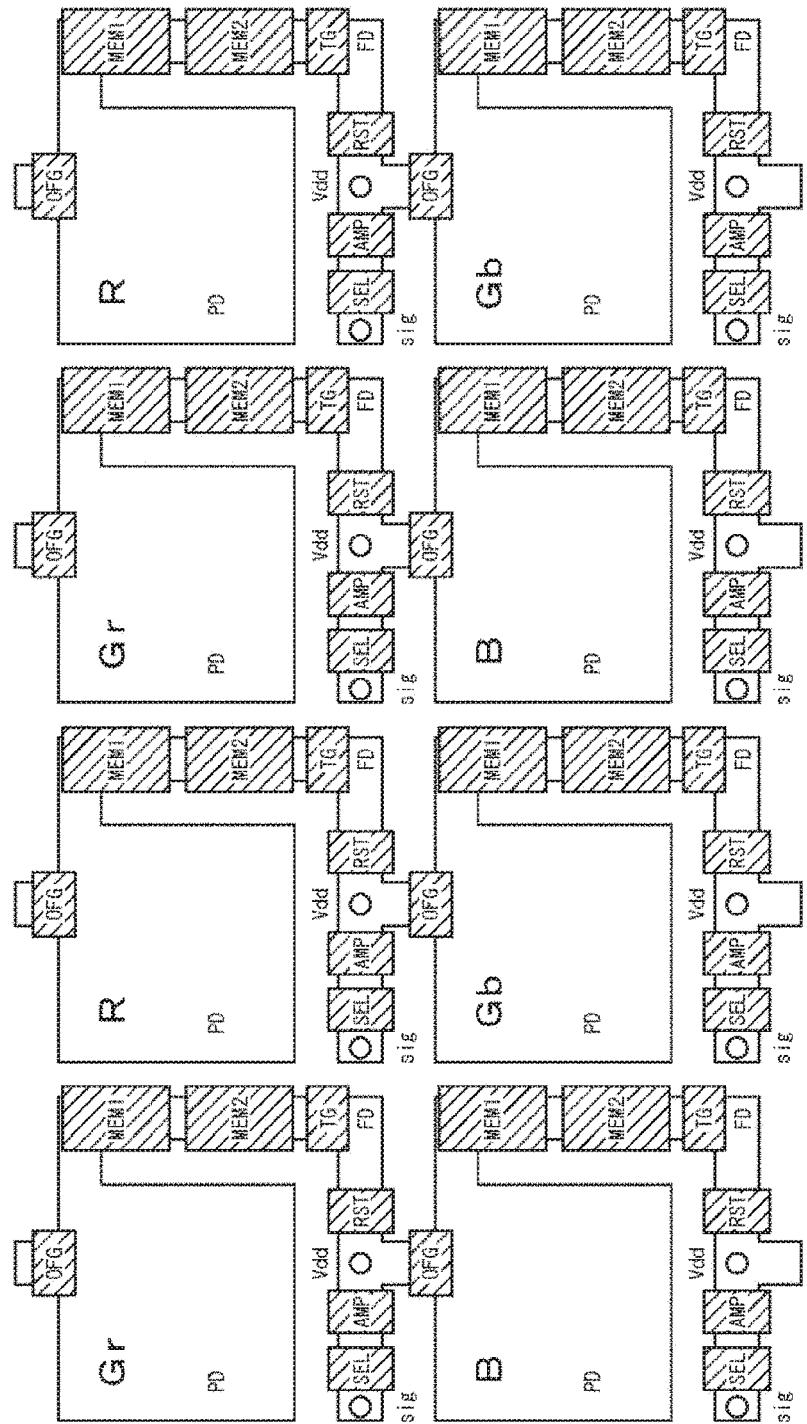
FIG. 17 is a diagram showing a first arrangement example of pixels in the solid-state imaging device.

FIG. 17 is a top view showing a first arrangement example of the pixels in the solid-state imaging device. Note that Gr, R, B, and Gb in the pixels indicate the color (wavelength) at which each pixel has sensitivity.

In the first arrangement example, in a case where attention is paid to the color of a pixel, a Bayer array is formed, the layout of the constituents of all the pixels is common, and the orientation of each pixel is also unified.

Figure 18:
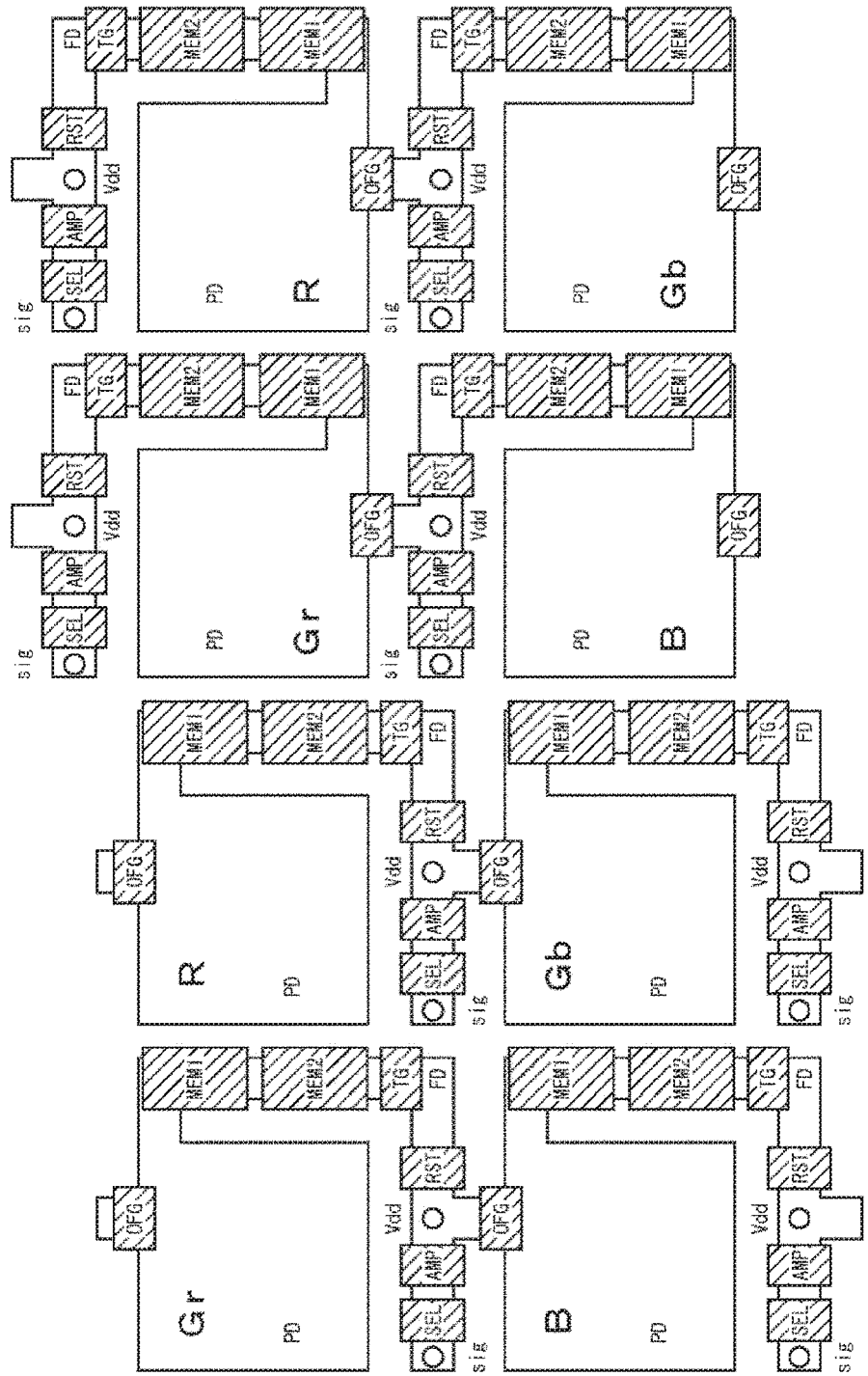
FIG. 18 is a diagram showing a second arrangement example of pixels in the solid-state imaging device.

FIG. 18 is a top view showing a second arrangement example of the pixels in the solid-state imaging device. In the second arrangement example, the orientation of 2×2 pixels adjacent in the lateral direction and forming the Bayer array is inverted upside down for each column.

According to the second arrangement example, the relative positional relationships among the PD 11, the first memory 13 and the second memory 14 are reversed upside down in the adjacent pixels of the same color in the lateral direction. Therefore, in the second arrangement example, only by adopting and executing one of the first pixel drive processing and the second pixel drive processing previously mentioned, the similar effects as those of a case where the first pixel drive processing and the second pixel drive processing are alternately executed at a predetermined cycle can be obtained.

Figure 19:
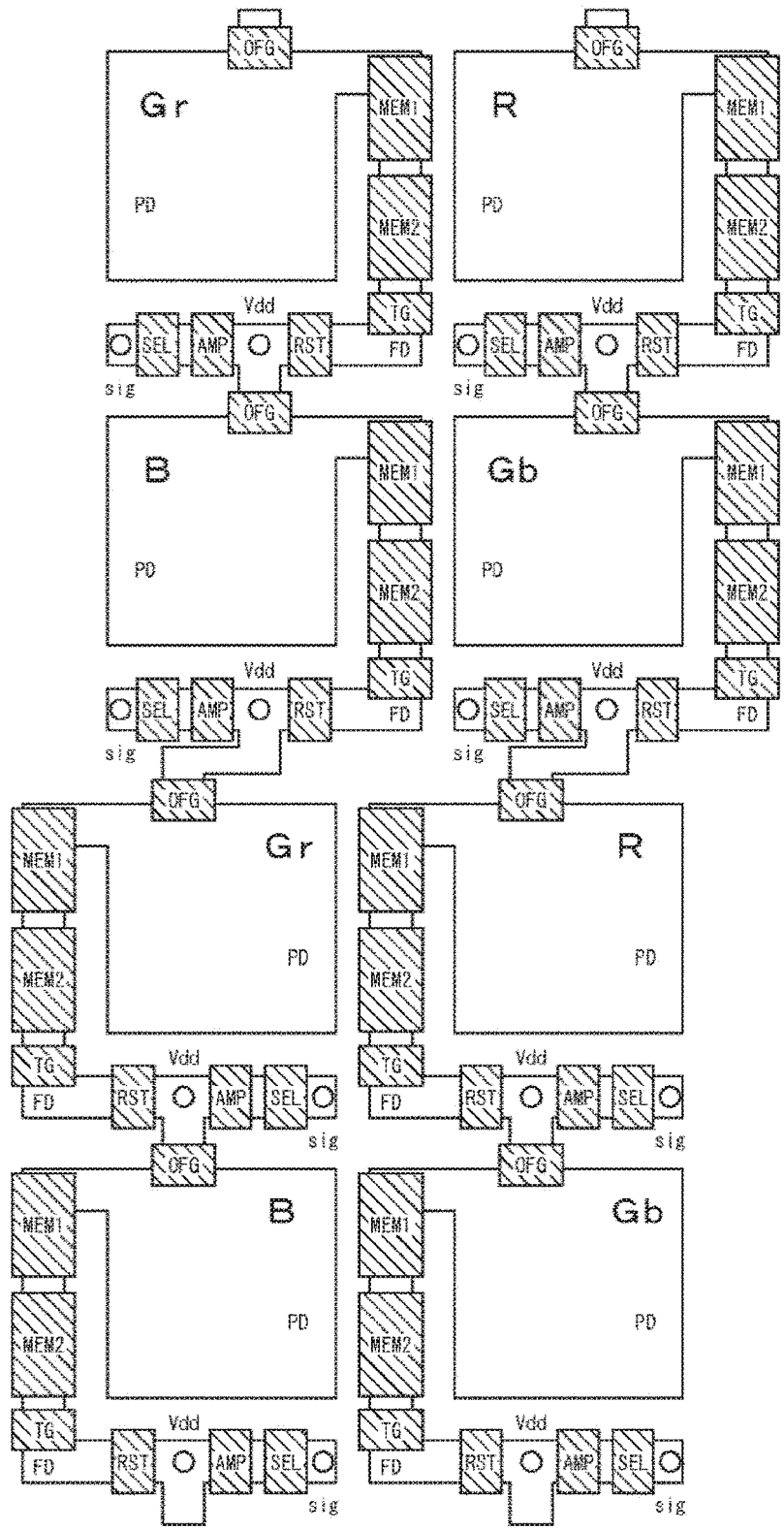
FIG. 19 is a diagram showing a third arrangement example of pixels in a solid-state imaging device.

FIG. 19 is a top view showing a third arrangement example of the pixels in the solid-state imaging device. In the third arrangement example, the orientation of 2×2 pixels adjacent in the vertical direction and forming the Bayer array is horizontally inverted for each row.

According to the third arrangement example, the relative positional relationships among the PD 11, the first memory 13 and the second memory 14 are reversed in the right-left direction in the pixels of the same color adjacent in the vertical direction. Therefore, in the third arrangement example, only by adopting and executing one of the first pixel drive processing and the second pixel drive processing previously mentioned, the similar effects as those of a case where the first pixel drive processing and the second pixel drive processing are alternately executed at a predetermined cycle can be obtained.

<Modification Example of Solid-State Imaging Device>

Figure 20:
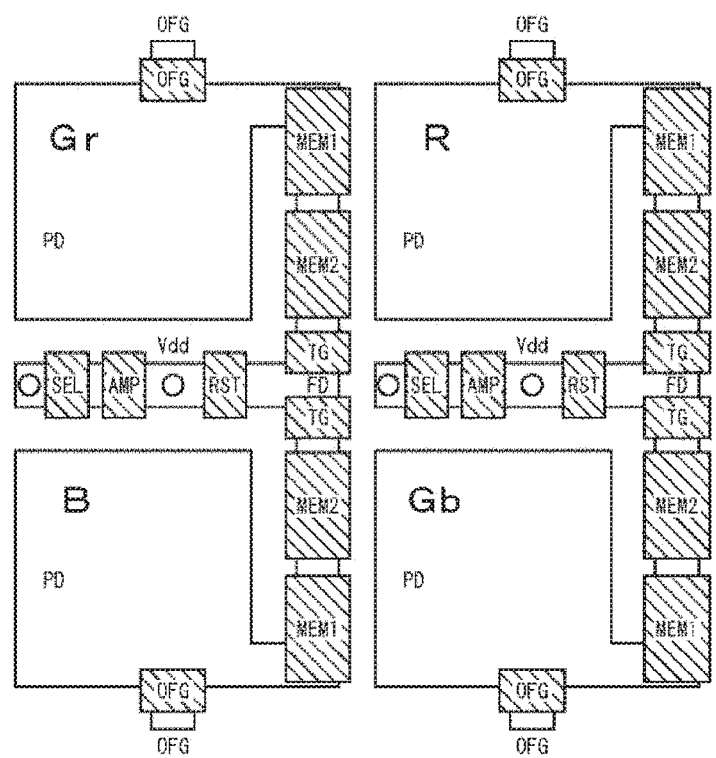
FIG. 20 is a diagram showing a first modification example of the solid-state imaging device.

FIG. 20 is a top view showing a first modification example of the solid-state imaging device shown in FIGS. 1 and 2. The first modification example has a configuration in which the FD 16, the RST transistor 17, the AMP transistor 18, and the SEL transistor 19 are shared by two pixels adjacent in the vertical direction.

According to the first modification example, it is possible to reduce the element area without changing the number of pixels of the solid-state imaging device.

Figure 21:
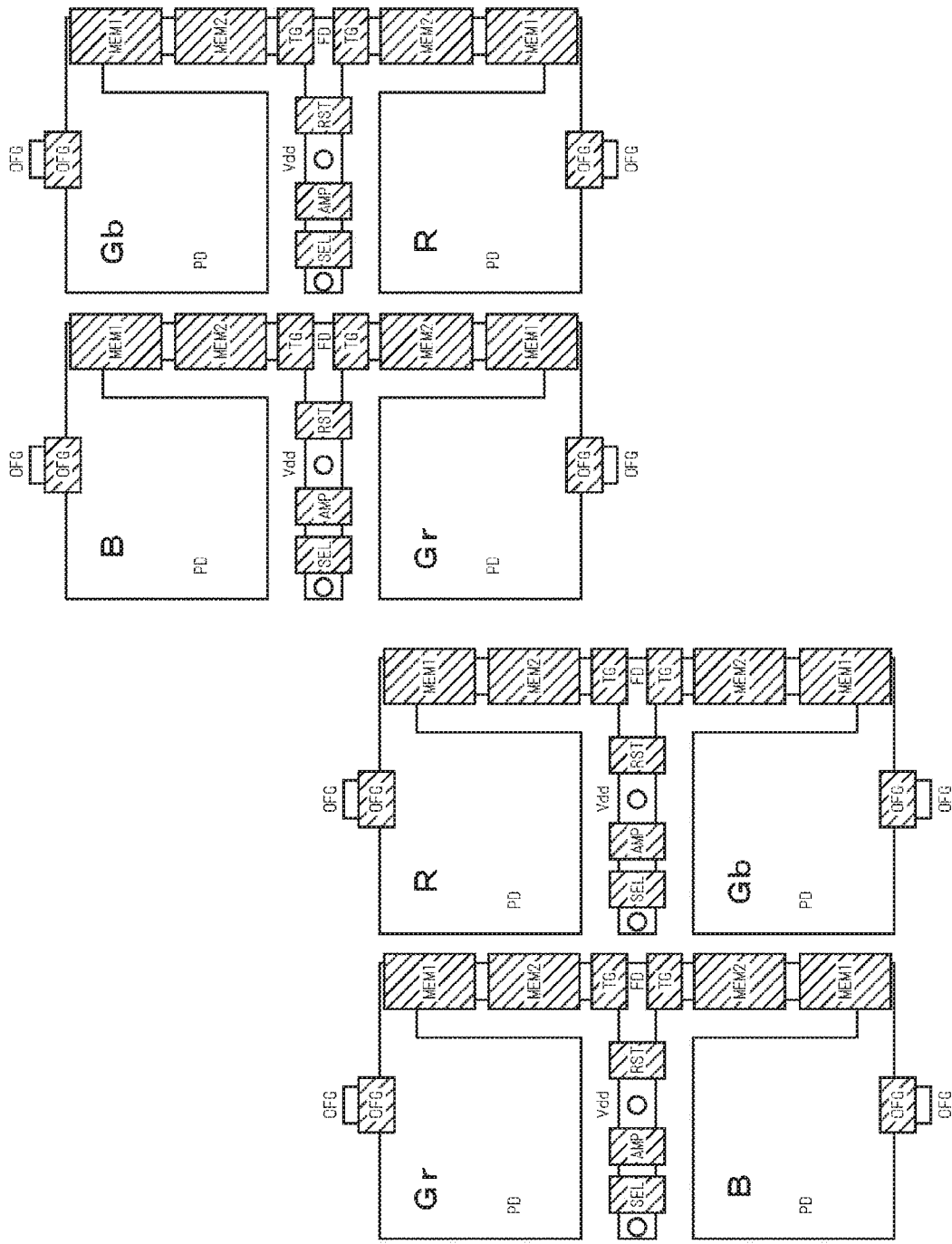
FIG. 21 is a diagram showing a fourth arrangement example of pixels in the solid-state imaging device.

FIG. 21 is a top view showing an arrangement example (fourth arrangement example) in a case where the first modification example shown in FIG. 20 is arranged on the solid-state imaging device. In the fourth arrangement example, 2×2 pixel units adjacent in the lateral direction are arranged by being shifted by one pixel in the column direction.

According to the fourth arrangement example, only by adopting and executing one of the first pixel drive processing and the second pixel drive processing previously mentioned, the similar effects as those of a case where the first pixel drive processing and the second pixel drive processing are alternately executed at a predetermined cycle can be obtained.

Figure 22:
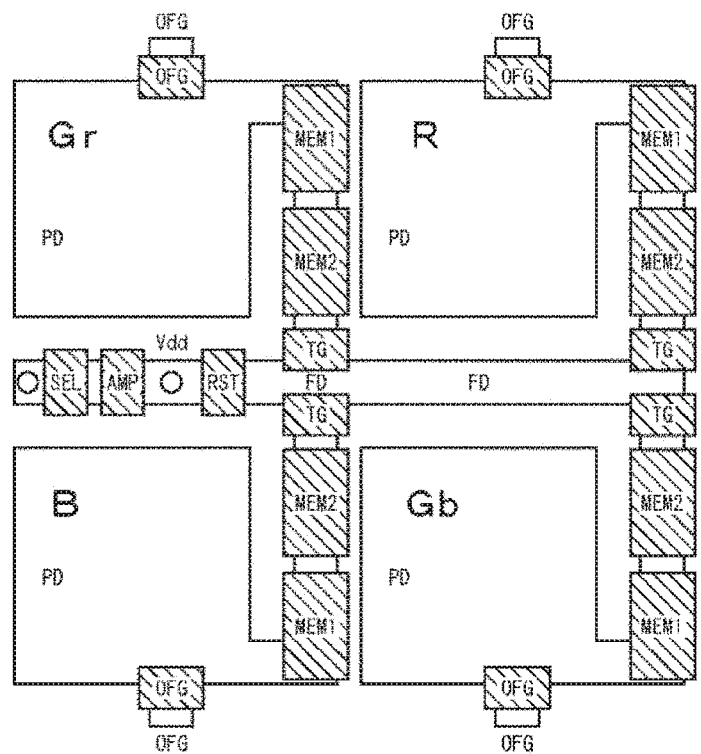
FIG. 22 is a diagram showing a second modification example of the solid-state imaging device.

FIG. 22 is a top view showing a second modification example of the solid-state imaging device shown in FIGS. 1 and 2. The second modification example has a configuration in which the FD 16, the RST transistor 17, the AMP transistor 18, and the SEL transistor 19 are shared by 2×2 pixels.

According to the second modification example, it is possible to further reduce the element area than the first modification example without changing the number of pixels of the solid-state imaging device.

<Usage Example of Solid-State Imaging Device>

Figure 23:
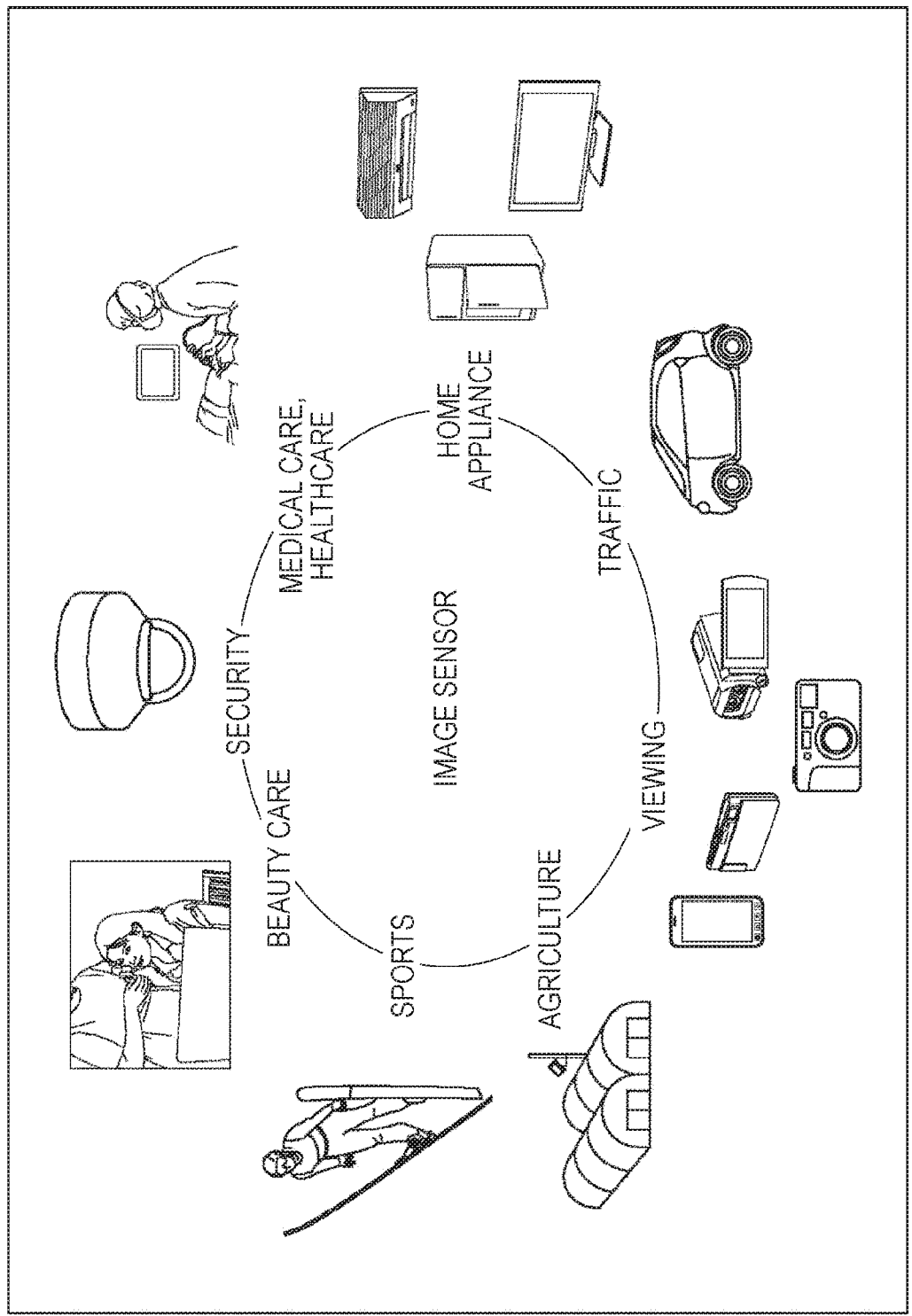
FIG. 23 is a diagram showing a usage example of the solid-state imaging device.

FIG. 23 shows a usage example of the solid-state imaging device according to the present embodiment.

The aforementioned solid-state imaging device can be used in, for example, various cases for sensing light such as visible light, infrared light, ultraviolet light and X-rays as described below.

A device, such as a digital camera or a portable apparatus with a camera function, which shoots an image to be used for viewing.

A device used for traffic, such as an in-vehicle sensor which shoots the front, rear, surroundings, inside and the like of an automobile for safe driving such as automatic stop, recognition of driver's condition, and the like, a surveillance camera which monitors traveling vehicles and roads, or a distance measuring sensor which measures the distance between the vehicles, and the like.

A device used for home appliances such as a TV, a refrigerator and an air conditioner for shooting user's gesture to perform apparatus operation according to that gesture.

A device used for medical care and healthcare, such as an endoscope or a device for performing angiography by receiving infrared light.

A device used for security, such as a surveillance camera used for crime prevention or a camera for personal authentication use.

A device used for beauty care, such as a skin measuring instrument which shoots skin or a microscope which shoots a scalp.

A device used for sports, such as an action camera or a wearable camera for sports applications and the like.

A device used for agriculture, such as a camera for monitoring the conditions of fields and crops.

Note that the embodiments of the present disclosure are not limited to the aforementioned embodiments, and various modifications can be made in a scope without departing from the gist of the present disclosure.

The present disclosure can take the following configurations.

(1)

A solid-state imaging device of a global shutter system, in which exposure periods of all pixels are unified, the solid-state imaging device including:

a photoelectric conversion unit which generates charges according to incident light for each pixel;

an accumulation unit which accumulates the signal charges generated by the photoelectric conversion unit and converts the signal charges into electric signals; and a first holding unit and a second holding unit which are arranged in series between the photoelectric conversion unit and the accumulation unit, temporarily hold the signal charges generated by the photoelectric conversion unit, and then transfer the signal charges to the accumulation unit, in which one of the first holding unit and the second holding unit is used to hold a noise charge to be input while holding the signal charges generated by the photoelectric conversion unit, and other of the first holding unit and the second holding unit is used to hold a noise charge to be input while not holding the signal charges generated by the photoelectric conversion unit.

(2)

The solid-state imaging device according to (1), further including an OFG which resets the photoelectric conversion unit by discharging the charges remaining in the photoelectric conversion unit.

(3)

The solid-state imaging device according to (1) or (2), in which the first holding unit and the second holding unit are configured by CCDs.

(4)

The solid-state imaging device according to any one of (1) to (3), in which the noise charge which is equivalent and generated in the photoelectric conversion unit due to stray light is input to the first holding unit and the second holding unit.

(5)

The solid-state imaging device according to any one of (1) to (4), in which the first holding unit and the second holding unit are arranged at symmetrical positions with respect to a focusing center of the photoelectric conversion unit.

(6)

The solid-state imaging device according to any one of (1) to (5), in which a first pixel drive processing in which an electric signal level, which is held by one of the first holding unit and the second holding unit and is based on the signal charges on which the noise charge is being superimposed, is acquired after an electric signal level based on the noise charge held by other of the first holding unit and the second holding unit, and a second pixel drive processing in which an electric signal level, which is held by one of the first holding unit and the second holding unit and is based on the signal charges on which the noise charge is being superimposed, is acquired before an electric signal level based on the noise charge held by other of the first holding unit and the second holding unit, are executed.

(7)

The solid-state imaging device according to (6), in which the first pixel drive processing and the second pixel drive processing are alternately executed for each frame.

(8)

The solid-state imaging device according to (6), in which the first pixel drive processing and the second pixel drive processing are alternately executed at each predetermined time.

(9)

The solid-state imaging device according to any one of (1) to (5), in which a positional relationship of the first holding unit and the second holding unit arranged at symmetrical positions with respect to the focusing center of the photoelectric conversion unit is switched for pixels of a same color in a same row or in a same column.

(10)

The solid-state imaging device according to (9), in which a first pixel drive processing in which an electric signal level, which is held by one of the first holding unit and the second holding unit and is based on the signal charges on which the noise charge is being superimposed, is acquired after an electric signal level based on the noise charge held by other of the first holding unit and the second holding unit, or a second pixel drive processing in which an electric signal level, which is held by one of the first holding unit and the second holding unit and is based on the signal charges on which the noise charge is being superimposed, is acquired before an electric signal level based on the noise charge held by other of the first holding unit and the second holding unit, is executed.

(11)

The solid-state imaging device according to any one of (1) to (10), in which the solid-state imaging device is of a backside illumination type.

(12)

The solid-state imaging device according to any one of (1) to (10), in which the solid-state imaging device is of a surface illumination type.

(13)

The solid-state imaging device according to any one of (1) to (12), in which the accumulation unit is shared by a plurality of pixels.

(14)

An electronic apparatus on which a solid-state imaging device of a global shutter system in which exposure periods of all pixels are unified is mounted, in which the solid-state imaging device includes:

a photoelectric conversion unit which generates charges according to incident light for each pixel;

an accumulation unit which accumulates the signal charges generated by the photoelectric conversion unit and converts the signal charges into electric signals; and a first holding unit and a second holding unit which are arranged in series between the photoelectric conversion unit and the accumulation unit, temporarily hold the signal charges generated by the photoelectric conversion unit, and then transfer the signal charges to the accumulation unit, one of the first holding unit and the second holding unit is used to hold a noise charge to be input while holding the signal charges generated by the photoelectric conversion unit, and other of the first holding unit and the second holding unit is used to hold a noise charge to be input while not holding the signal charges generated by the photoelectric conversion unit.

REFERENCE SIGNS LIST

11 PD
12 OFG
13 First memory
14 Second memory
15 Transfer gate
16 FD
17 RST transistor
18 AMP transistor
19 SEL transistor
20 VSL

The invention claimed is:

1. A solid-state imaging device, comprising:
a photoelectric conversion unit configured to generate signal charges for each pixel of a plurality of pixels based on incident light;
an accumulation unit configured to:
accumulate the signal charges; and
convert the signal charges into electric signals; and
a first holding unit and a second holding unit, wherein
each of the first holding unit and the second holding unit is between the photoelectric conversion unit and the accumulation unit,
the first holding unit and the second holding unit are in series,
the first holding unit and the second holding unit are at symmetrical positions with respect to a focusing center of the photoelectric conversion unit, and
each of the first holding unit and the second holding unit is configured to:
hold the signal charges; and
transfer the signal charges to the accumulation unit, wherein
one of the first holding unit or the second holding unit is configured to concurrently hold a noise charge and the signal charges, and
other of the first holding unit or the second holding unit is configured to hold the noise charge.

2. The solid-state imaging device according to claim 1, further comprising an overflow gate (OFG) configured to:
discharge residue charges in the photoelectric conversion unit; and
reset the photoelectric conversion unit based on the discharge of the residue charges.

3. The solid-state imaging device according to claim 2, wherein each of the first holding unit and the second holding unit includes charge coupled devices (CCDs).

4. The solid-state imaging device according to claim 2, wherein the photoelectric conversion unit is further configured to generate the noise charge based on stray light, and the first holding unit and the second holding unit are further configured to receive the noise charge from the photoelectric conversion unit.

5. The solid-state imaging device according to claim 2, wherein the accumulation unit is further configured to:

acquire, in a first pixel drive process, a first electric signal level after a second electric signal level based on the noise charge held by one of the first holding unit or the second holding unit, wherein the first electric signal level is based on the signal charges superimposed with the noise charge and is held by other of the first holding unit or the second holding unit; and acquire, in a second pixel drive process, a third electric signal level before a fourth electric signal level based on the noise charge held by the one of the first holding unit or the second holding unit, wherein the third electric signal level is based on the signal charges superimposed with the noise charge and is held by the other of the first holding unit or the second holding unit.

6. The solid-state imaging device according to claim 5, wherein execution of each of the first pixel drive process and the second pixel drive process is alternate for each frame of the plurality of pixels.

7. The solid-state imaging device according to claim 5, wherein execution of each of the first pixel drive process and the second pixel drive process is based on a specific time.

8. The solid-state imaging device according to claim 1, wherein reversal of a positional relationship of the first holding unit and the second holding unit is based on specific pixels of a same color in one of a same row or in a same column.

9. The solid-state imaging device according to claim 8, wherein the accumulation unit is further configured to:

acquire, in a first pixel drive process, a first electric signal level after a second electric signal level based on the noise charge held by one of the first holding unit or the second holding unit, wherein the first electric signal level is based on the signal charges superimposed with the noise charge and is held by other of the first holding unit or the second holding unit; and acquire, in a second pixel drive process, a third electric signal level before a fourth electric signal level based on the noise charge held by the one of the first holding unit or the second holding unit, wherein the third electric signal level is based on the signal charges superimposed with the noise charge and is held by the other of the first holding unit or the second holding unit.

10. The solid-state imaging device according to claim 2, wherein a type of the solid-state imaging device is a backside illumination type.

11. The solid-state imaging device according to claim 2, wherein a type of the solid-state imaging device is a surface illumination type.

12. The solid-state imaging device according to claim 2, wherein the accumulation unit is associated with each of the plurality of pixels.

13. An electronic apparatus, comprising:

a solid-state imaging device, wherein the solid-state imaging device comprises:

a photoelectric conversion unit configured to generate signal charges for each pixel of a plurality of pixels based on incident light;

an accumulation unit configured to:

accumulate the signal charges; and convert the signal charges into electric signals; and a first holding unit and a second holding unit, wherein each of the first holding unit and the second holding unit is between the photoelectric conversion unit and the accumulation unit, the first holding unit and the second holding unit are in series, the first holding unit and the second holding unit are at symmetrical positions with respect to a focusing center of the photoelectric conversion unit, and each of the first holding unit and the second holding unit is configured to:

hold the signal charges; and transfer the signal charges to the accumulation unit, wherein one of the first holding unit or the second holding unit is configured to concurrently hold a noise charge and the signal charges, and other of the first holding unit or the second holding unit is configured to hold the noise charge.

* * * * *